(12) United States Patent
Xiong et al.

(10) Patent No.: US 9,978,818 B2
(45) Date of Patent: May 22, 2018

(54) DISPLAY PANEL, DISPLAY DEVICE AND MANUFACTURING METHOD OF DISPLAY PANEL

(71) Applicants: Shanghai Tianma AM-OLED Co., Ltd., Shanghai (CN); Tianma Micro-Electronics Co., Ltd., Shenzhen (CN)

(72) Inventors: Zhiyong Xiong, Shanghai (CN); Zhongshou Huang, Shanghai (CN); Zhiliang Wang, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 5 days.

(21) Appl. No.: 14/706,347

(22) Filed: May 7, 2015

(65) Prior Publication Data
US 2016/0268354 A1 Sep. 15, 2016

(30) Foreign Application Priority Data
Mar. 13, 2015 (CN) .......................... 2015 1 0112340

(51) Int. Cl.
*H01L 29/08* (2006.01)
*H01L 27/32* (2006.01)
(Continued)

(52) U.S. Cl.
CPC ...... *H01L 27/3246* (2013.01); *H01L 51/5056* (2013.01); *H01L 51/5072* (2013.01);
(Continued)

(58) Field of Classification Search
CPC .................................................. H01L 27/3246
(Continued)

(56) References Cited

U.S. PATENT DOCUMENTS

2006/0145602 A1* 7/2006 Yoo ...................... H01L 27/3253
313/504
2012/0248475 A1* 10/2012 Yamada ................ H01L 27/322
257/89

(Continued)

FOREIGN PATENT DOCUMENTS

| CN | 102738200 A | 10/2012 |
| CN | 103137893 A | 6/2013 |
| KR | 100646936 B1 | 11/2006 |

*Primary Examiner* — Ajay K Arora
(74) *Attorney, Agent, or Firm* — Faegre Baker Daniels LLP

(57) ABSTRACT

The present disclosure discloses a display panel, a display device and a manufacturing method of a display panel. The display panel includes: a substrate; a pixel definition layer disposed on the substrate, with a plurality of pixel regions being defined in the pixel definition layer; and an organic common layer disposed on the pixel regions and the pixel definition layer; wherein, a thickness of at least one portion of the organic common layer corresponding to the pixel definition layer is less than that of at least one portion of the organic common layer corresponding to the pixel region; or at least one recess is disposed in a portion of the pixel definition layer between adjacent pixel regions or in every pixel definition layer between two adjacent pixel regions, and the organic common layer covers the recess.

20 Claims, 13 Drawing Sheets

(51) Int. Cl.
*H01L 51/50* (2006.01)
*H01L 51/56* (2006.01)

(52) U.S. Cl.
CPC .......... *H01L 27/3211* (2013.01); *H01L 51/56* (2013.01); *H01L 2251/558* (2013.01)

(58) Field of Classification Search
USPC ......................................................... 257/40
See application file for complete search history.

(56) References Cited

U.S. PATENT DOCUMENTS

2014/0361260 A1* 12/2014 Kim .................... H01L 27/3246
 257/40
2015/0069361 A1* 3/2015 Sato .................... H01L 51/5243
 257/40

\* cited by examiner

DISPLAY PANEL, DISPLAY DEVICE AND MANUFACTURING METHOD OF DISPLAY PANEL

CROSS-REFERENCE TO RELATED APPLICATION

This application claims priority to Chinese Application No. 201510112340.8, filed Mar. 13, 2015, which is herein incorporated by reference in its entirety.

TECHNICAL FIELD

The present disclosure relates to the field of display technologies, in particular to a display panel, a display device and a manufacturing method of the display panel.

BACKGROUND

An Active Matrix Organic Light Emitting Diode (AMOLED) display panel has advantages such as self-luminescence, low power consumption, fast response speed, high contrast ratio and wide visual angle, and thus has a wide application prospect in the field of display technologies.

However, in the related art, when the AMOLED display panel displays an image and a portion of pixel regions in the AMOLED display panel illuminate, a strong leakage current is generated between the illuminating pixel region and a non-illuminating pixel region adjacent to the illuminating pixel region and causes the non-illuminating pixel region to illuminate slightly, thereby decreasing quality of the image displayed by the display panel.

SUMMARY

In view of the above, embodiments of the present disclosure provide a display panel, a display device and a manufacturing method of the display panel to solve the technical problem of decreasing the quality of an image displayed by the AMOLED display panel in the related art.

Embodiments of the disclosure provide a display panel, including: a substrate; a pixel definition layer disposed on the substrate, with a plurality of pixel regions being defined in the pixel definition layer; and an organic common layer disposed on the pixel regions and the pixel definition layer; wherein, a thickness of at least one portion of the organic common layer corresponding to the pixel definition layer is less than that of at least one portion of the organic common layer corresponding to the pixel region; or at least one recess is disposed in a portion of the pixel definition layer between adjacent pixel regions or in every pixel definition layer between two adjacent pixel regions, and the organic common layer covers the recess.

Embodiments of the disclosure provide a display device, including the display panel described above.

Embodiments of the disclosure provide a manufacturing method of a display panel, including: providing a substrate; forming a pixel definition layer on the substrate, with a plurality of pixel regions being defined in the pixel definition layer; forming at least one recess in a portion of the pixel definition layer between adjacent pixel regions or in every pixel definition layer between two adjacent pixel regions; and forming an organic common layer, wherein, the organic common layer is formed on the pixel regions and the pixel definition layer and covers the recess.

Embodiments of the disclosure provide a manufacturing method of a display panel, the method includes: providing a substrate; forming a pixel definition layer on the substrate, with a plurality of pixel regions being defined in the pixel definition layer; and forming an organic common layer, wherein, the organic common layer is formed on the pixel regions and the pixel definition layer, and the thickness of at least one portion of the organic common layer corresponding to the pixel definition layer is less than the thickness of at least one portion of the organic common layer corresponding to the pixel region.

With the display panel, the display device and the manufacturing method of the display panel, a thickness of at least one portion of the organic common layer corresponding to the pixel definition layer in the display panel is less than that of at least one portion of the organic common layer corresponding to the pixel region; or at least one recess is disposed in a portion of the pixel definition layer between adjacent pixel regions or in every pixel definition layer between two adjacent pixel regions, and the organic common layer covers the recess, such that the resistance of the organic common layer between the pixel regions can be increased, and thus the leakage current generated between the illuminating pixel region and the non-illuminating pixel region can be reduced or even restrained, and the non-illuminating pixel region can be kept in a dark state, thereby improving quality of an image displayed by the display panel.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

Other features, objects and advantages of the present disclosure will become more apparent from the detailed description for non-limiting embodiments made with reference to the accompany drawings, in which.

Figure 1:
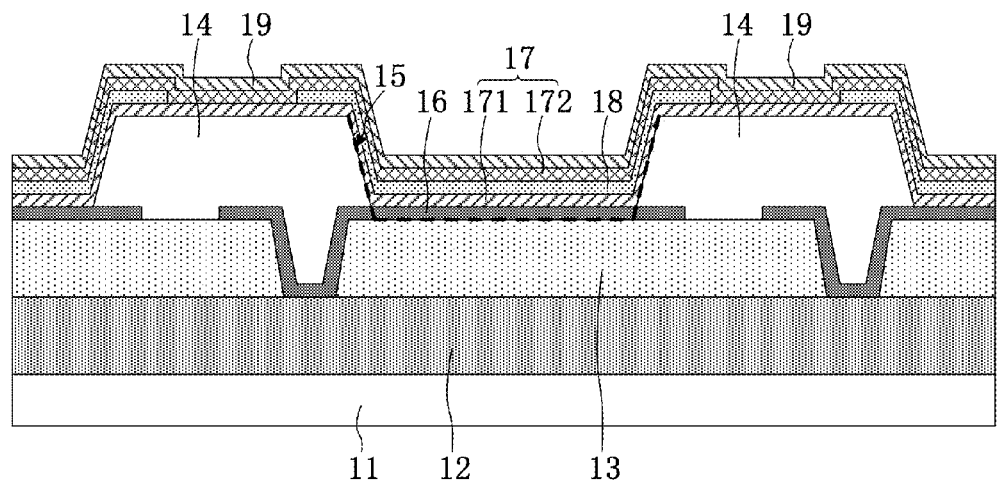
FIG. 1 is a schematic diagram illustrating the structure of the existing AMOLED display panel.

While the disclosure is amenable to various modifications and alternative forms, specific embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The present disclosure will be further described in detail below in conjunction with the accompanying drawings and embodiments. It should be noted that the specific embodiments disclosed herein are merely intended for explaining, rather than limiting, the disclosure. It should also be noted that the accompanying drawings show only parts relating to the disclosure, but not in an exhausting way, for the ease of description.

Before describing embodiments of the disclosure, a structure of the existing AMOLED display panel is introduced. As shown in FIG. 1 which is a schematic diagram illustrating the structure of the existing AMOLED display panel, the existing AMOLED display panel includes: a substrate 11; a thin film transistor layer 12 disposed on the substrate 11, where thin film transistors having a switching function are provided on the thin film transistor layer 12; a planarization layer 13 disposed on the thin film transistor layer 12; a pixel definition layer 14 disposed on the planarization layer 13, where a plurality of pixel regions 15 are defined in the pixel definition layer 14; an anode 16 disposed on the planarization layer 13 and located in the pixel region 15; an organic common layer 17 disposed on the pixel definition layer 14 and the anode 16, where the organic common layer 17 includes a hole transport layer 171 and an electron transport layer 172 disposed on the hole transport layer 171; an organic light emitting layer 18 disposed between the hole transport layer 171 and the electron transport layer 172; and a cathode 19 disposed on the electron transport layer 172.

The above existing AMOLED display panel functions in such a display principle that: when certain voltages are respectively applied to the anode 16 and the cathode 19, holes are injected from the anode 16 into the hole transport layer 171 and electrons are injected from the cathode 19 into the electron transport layer 172, and then the holes and electrons are transferred to the organic light emitting layer 18 through the hole transport layer 171 and the electron transport layer 172, respectively, and thus encounter each other in the organic light emitting layer 18 to form excitons which in turn excite light emitting molecules in the organic light emitting layer 18 to emit visible light, thus achieving the display effect of the AMOLED display panel.

In the related art, when the AMOLED display panel displays an image and a portion of pixel regions in the AMOLED display panel illuminate, because the electron transport layers in adjacent pixel regions are connected with each other and hole transport layers in adjacent pixel regions are connected with each other, the electrons injected into the electron transport layer in the illuminating pixel region and holes injected into the hole transport layer in the illuminating pixel region could be transferred toward a non-illuminating pixel region adjacent to the illuminating pixel region, and hence a strong leakage current is generated between the illuminating pixel region and the adjacent non-illuminating pixel region, causing the non-illuminating pixel region to illuminate slightly, thereby decreasing quality of an image displayed by the display panel.

In view of the above, embodiments of the disclosure provide technical solutions as follows.

Figure 2A:
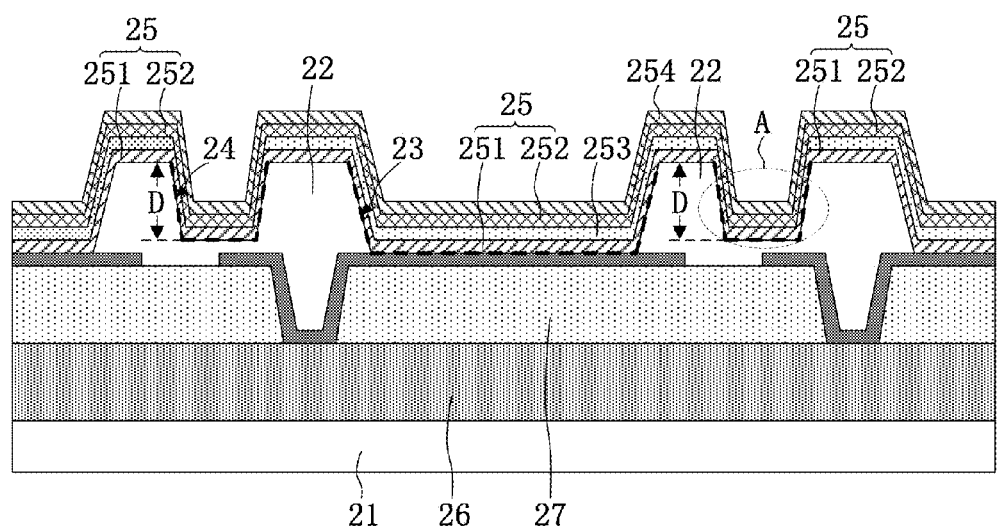
FIG. 2A is a schematic diagram showing the structure of a display panel, according to embodiments of the disclosure.

Embodiment of the disclosure provide a display panel. As shown in FIG. 2A which is a schematic diagram showing the structure of a display panel, according to embodiments of the disclosure, the display panel includes: a substrate 21; a pixel definition layer 22 disposed on the substrate 21, where, a plurality of pixel regions 23 are defined in the pixel definition layer 22; in some embodiments, at least one recess 24 is disposed in a portion of the pixel definition layer 22 between adjacent pixel regions 23 or disposed in every pixel definition layer 22 between two adjacent pixel regions 23; and an organic common layer 25, which is disposed on the pixel regions 23 and the pixel definition layer 22, and covers the recess 24. In some embodiments, the mass of the pixel definition layer 22 before forming the recess 24 is larger than the mass of the pixel definition layer 22 formed with the recess 24, i.e. the mass of the pixel definition layer 22 is reduced in forming the recess 24. The recess 24 can be formed by using an etching or laser radiation process, such as a dry etching process, a wet etching process or a laser burning process. In the disclosure, the recess 24 is required to have a sufficient depth in order to effectively increase the resistance of the organic common layer 25 between adjacent pixel regions 23, and the above processes of forming the recess 24 are applicable to form the recess with the desired depth. In some embodiments, the depth D of the recess 24 is larger than or equal to 0.5 μm. It has been found that, if the depth of the recess 24 is less than 0.5 μm, the effect of the resistance adjustment of the organic common layer 25 between the adjacent pixel regions 23 is limited, and the function of restraining the transfer of the electrons and/or holes between the adjacent pixel regions 23 is weak.

Figure 2B:
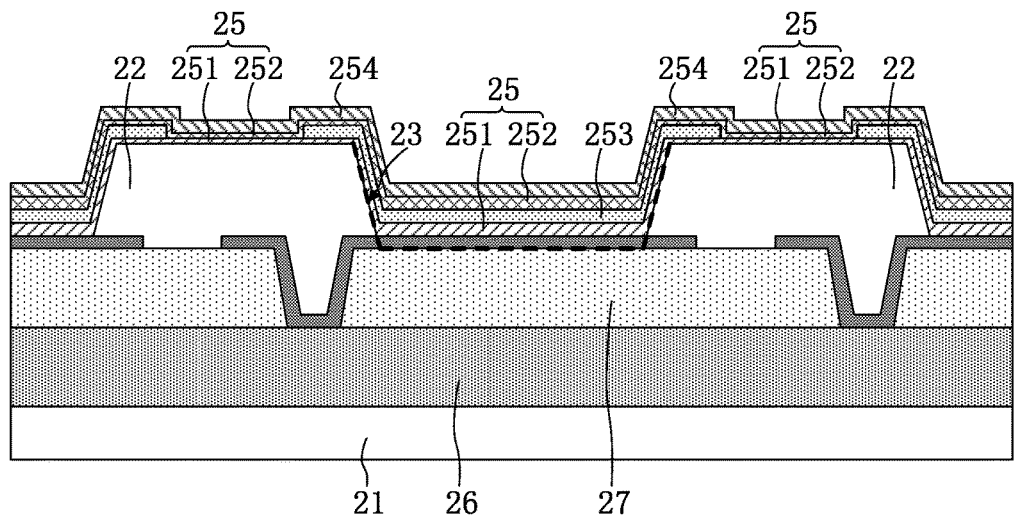
FIG. 2B is a schematic diagram showing the structure of a display panel, according to embodiments of the disclosure.

As shown in FIG. 2B, a thickness of at least one portion of the organic common layer 25 corresponding to the pixel definition layer 22 is less than that of at least one portion of the organic common layer 25 corresponding to the pixel regions 23, so that the organic common layer corresponding to the pixel definition layer has a larger resistance than that corresponding to the pixel region, and hence the transfer of the electrons and/or holes between the adjacent pixel regions can be restrained, thus the leakage current generated between the illuminating pixel region 23 and the non-illuminating pixel region 23 can be prevented, and hence the non-illuminating pixel region can be kept in a dark state, thereby improving quality of an image displayed by the display panel. The arrangement of the thickness of the organic common layer corresponding to the pixel definition layer and the thickness of the organic common layer corresponding to the pixel regions can be implemented using an oblique vapor deposition process, in which an angle is present between a direction of the vapor deposition and a direction perpendicular to the substrate. In some embodiments, the angle is an acute angle. In some embodiments, the direction of the vapor deposition is the same as the direction of a bevel edge of the pixel definition layer. In some embodiments, the region of the organic common layer corresponding to the pixel definition layer has discontinuousness, so that the transfer of the electrons and/or holes between the adjacent pixel regions can further be blocked. In some embodiments, the organic common layer is etched using a half-tone mask so that the thickness of the at least one portion of the organic common layer corresponding to the pixel definition layer is less than the thickness of the at least one portion of the organic common layer corresponding to the pixel region. As such, in the disclosure, the resistance of the portion of the organic common layer corresponding to the pixel region is increased in order to avoid crosstalk of the electrons and/or holes between the adjacent pixel regions, thus uncontrollability of the brightness or darkness of the pixel region caused by the crosstalk is avoided. The method of restraining the transfer of the electrons and/or holes between the adjacent pixel regions according to the disclosure includes, but is not limited to the above two manners, and may also be implemented by changing the material of the organic common layer and so on, all of which should fall into the concept of the disclosure.

As shown in FIG. 2A or 2B, the display panel can further include a thin film transistor layer 26 and a planarization layer 27 both disposed between the substrate 21 and the pixel definition layer 22, and the planarization layer 27 is located above the thin film transistor layer 26 disposed on the substrate 21. The organic common layer 25 includes a hole transport layer 251 and an electron transport layer 252 disposed on the hole transport layer 251. The organic common layer 25 is disposed on the pixel definition layer 22 and covers the recess 24, and is further disposed in the pixel regions 23. Additionally, the display panel shown in FIG. 2A further includes: an organic light emitting layer 253 disposed between the hole transport layer 251 and the electron transport layer 252, and a cathode 254 disposed on the electron transport layer 252. It is noted in embodiments of the disclosure that a direction from the substrate 21 to the pixel definition layer 22 is referred to as an upward direction, and an opposite direction thereof is referred to as a downward direction. Describing one element as being above or below another element merely intends to illustrate the relative orientation of the elements, the elements may be in direct contact with each other or be separate, and specific structure thereof is not limited herein.

Based on the above description, the display panel according to embodiments of the disclosure can be used as the AMOLED display panel. As shown in FIG. 2A, unlike the case where a recess is not disposed between the pixel regions 23 in the related art, the recess 24 is disposed in the pixel definition layer 22 between a portion of adjacent pixel regions 23 or disposed in the pixel definition layer 22 between every two adjacent pixel regions 23 in the display panel of the disclosure, and the recess 24 is covered by the organic common layer 25, so that the length of the organic common layer 25 between the pixel regions 23 can be increased due to the presence of the recess 24, i.e. the lengths of both the hole transport layer 251 and the electron transport layer 252 between the pixel regions 23 can be increased due to the presence of the recess 24, and thus the resistances of both the hole transport layer 251 and the electron transport layer 252 between the adjacent pixel regions 23 can be increased. When a pixel region 23 in the display panel illuminates, the transfer of the electrons and/or holes between the illuminating pixel region 23 and a non-illuminating pixel region adjacent to the illuminating pixel region 23 can be reduced because the resistances of both the hole transport layer and the electron transport layer between the adjacent pixel regions are increased, and hence the leakage current generated between the illuminating pixel region 23 and the non-illuminating pixel region 23 can be reduced or even eliminated, so that the non-illuminating pixel region can be kept in a dark state, thereby improving quality of an image displayed by the display panel.

Figure 3:
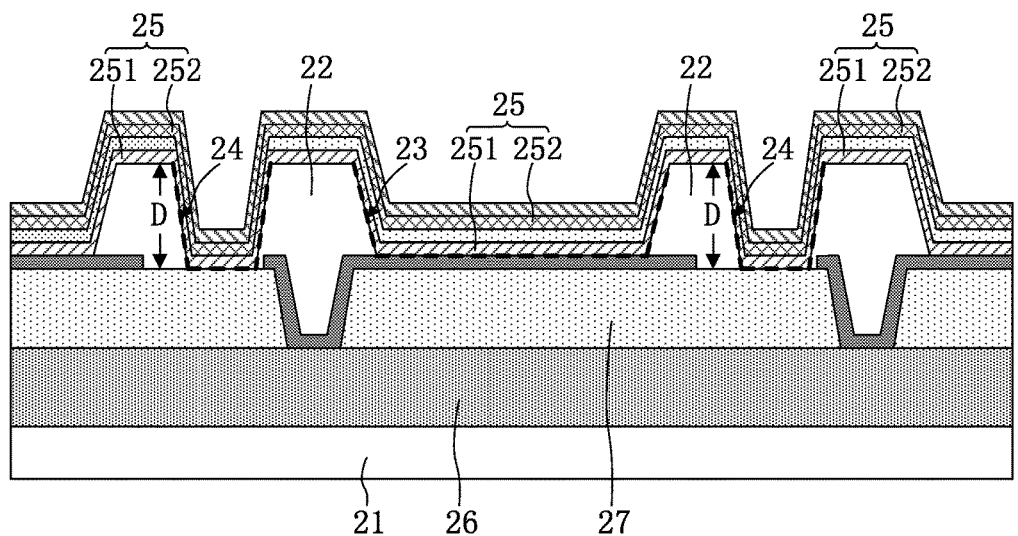
FIG. 3 is a schematic diagram showing the structure of a display panel, according to embodiments of the disclosure.

As shown in FIG. 2A, the bottom of the recess 24 is placed within the pixel definition layer 22, which is an example of arrangement of the recess within the pixel definition layer, according to embodiments of the disclosure. In another example of the disclosure, as shown in FIG. 3, the recess 24 extends through the pixel definition layer 22 and reaches the planarization layer 27. Compared with the recess shown in FIG. 2A, the recess 24 shown in FIG. 3 has a deeper depth, and accordingly the organic common layer 25 between the pixel regions 23 becomes even longer due to the presence of the recess 24, and thus the resistance of the organic common layer 25 between corresponding pixel regions 23 as shown in FIG. 3 is much larger than the resistance of the organic common layer 25 between corresponding pixel regions 23 as shown in FIG. 2A, so that the display panel shown in FIG. 3 can more effectively reduce or even eliminate the leakage current generated between the illuminating pixel region 23 and the non-illuminating pixel region 23, and thus the non-illuminating pixel region can be kept better in a dark state, thereby improving quality of an image displayed by the display panel.

Figure 4:
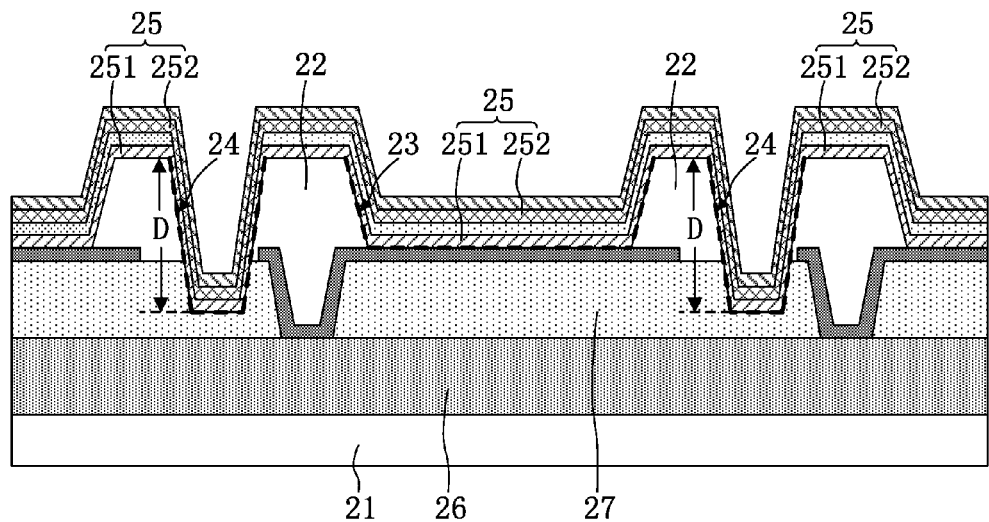
FIG. 4 is a schematic diagram showing the structure of a display panel, according to embodiments of the disclosure.

In embodiments of the disclosure, the planarization layer 27, which is configured to planarize a surface of the thin film transistor layer 26 below the planarization layer 27, is disposed below the pixel definition layer 22 in the display panel. On the basis of the display panel shown in FIG. 2A or FIG. 3, to further increase the depth of the recess, the recess 24 can extend through the pixel definition layer 22 and into the planarization layer 27, so that the bottom of the recess is disposed in the planarization layer 27, as shown in FIG. 4. Since the recess 24 shown in FIG. 4 has a larger depth than the recess shown in FIG. 2A or 3, the resistance of the organic common layer 25 between the pixel regions 23 due to the presence of the recess 24 is much larger than the resistance of the organic common layer 25 between the pixel regions 23 in FIG. 2A or 3, so that the leakage current generated between the illuminating pixel region 23 and the non-illuminating pixel region 23 can be further reduced or even eliminated, and thus the non-illuminating pixel region 23 can be kept better in a dark state, thereby improving quality of an image displayed by the display panel.

It is noted that the depths of the recesses provided in the pixel definition layer between the pixel regions may be all same, or partially same, or different from each other, depending actual requirements or actual manufacture process conditions, which is not limited herein.

Figure 5:
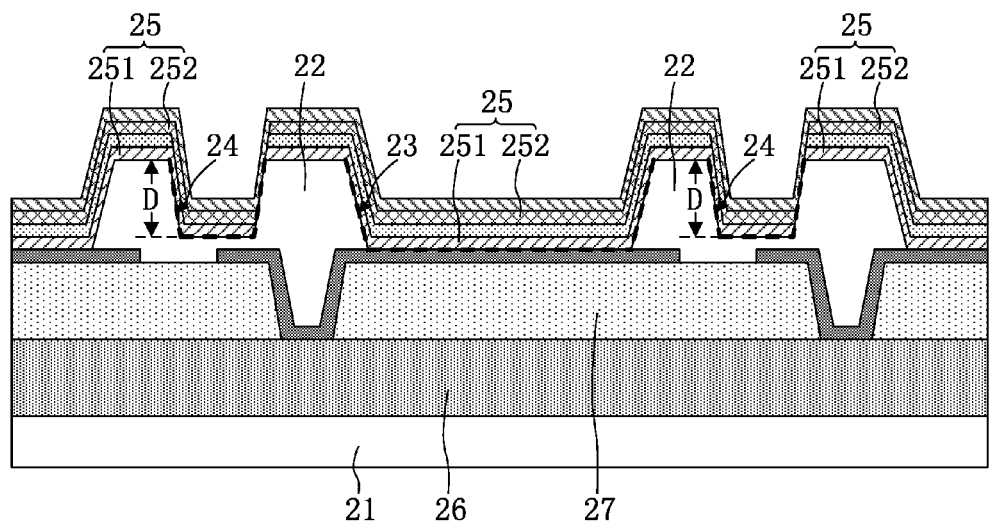
FIG. 5 is a schematic diagram showing the structure of a display panel, according to embodiments of the disclosure.

In the display panels shown in FIGS. 2A, 3 and 4, the organic common layer 25 covers all recesses 24, so that the length of the organic common layer 25 between the pixel regions 23 can be increased, and the resistance of the organic common layer 25 between the pixel regions 23 is increased, thereby reducing or even eliminating the leakage current generated between the illuminating pixel region 23 and the non-illuminating pixel region 23. As such, examples of the position relationship between the organic common layer and the recess in the display panel have been illustrated. In other examples, the organic common layer may alternatively cover a portion of the recess. As shown in FIG. 5, the organic common layer 25 covers a left side wall and the bottom of the recess 24, but does not cover a right side wall of the recess 24, i.e. the organic common layer 25 between the pixel region 23 at the position of the recess 24 is discontinuous, such that the resistance of the organic common layer 25 between the pixel regions 23 can be considered as infinite, and thus the leakage current generated between the illuminating pixel region 23 and the non-illuminating pixel region 23 can be restrained, and the non-illuminating pixel region 23 can be kept in a dark state, thereby improving quality of an image displayed by the display panel.

It is noted that covering merely the left side wall and the bottom of the recess 24 by the organic common layer 25 as shown in FIG. 5 is an example illustrating the covering of a portion of the recess by the organic common layer. In other examples, the organic common layer may merely cover the right side wall and the bottom of the recess, or merely cover the left side wall of the recess, or merely cover the right side wall of the recess, or merely cover a portion of one side wall (such as the left side wall or right side wall) of the recess, or merely cover one side wall of the recess, the bottom of the recess or a portion of another side wall of the recess and so on, as long as covering the recess by the organic common layer allows the organic common layer between pixel regions to be discontinuous so that the resistance of the corresponding organic common layer becomes infinite, which is not limited thereto.

Figure 6:
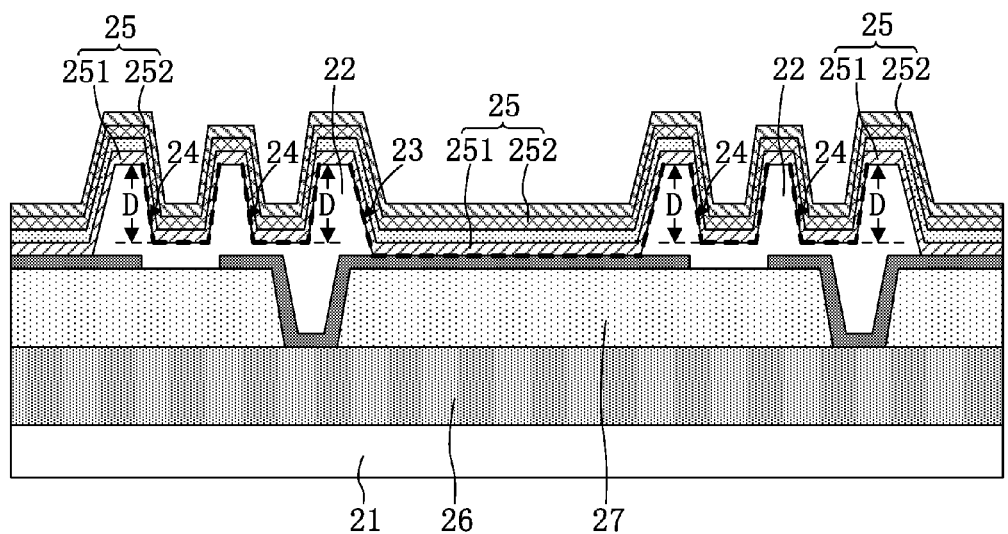
FIG. 6 is a schematic diagram showing the structure of a display panel, according to embodiments of the disclosure.

In the figures described above, one recess is provided in the pixel definition layer between adjacent pixel regions. However, there may be a plurality of recesses in the pixel definition layer between adjacent pixel regions. As shown in FIG. 6, there are two recesses 24 in the pixel definition layer 22 between adjacent pixel regions 23, bottoms of the recesses 24 are disposed in the pixel definition layer 22 and the organic common layer 25 completely covers the recesses 24. Compared with the display panel shown in FIG. 2A, given that the recesses 24 as shown in FIG. 6 have the same depth as those shown in FIG. 2A, the length of the organic common layer 25 between the pixel regions 23 is significantly increased due to the presence of the recesses 24 in the display panel shown in FIG. 6, so that the resistance of the organic common layer 25 between the pixel regions 23 can be significantly increased, and hence the leakage current generated between the illuminating pixel region 23 and the non-illuminating pixel region 23 can be effectively reduced or even eliminated, and the non-illuminating pixel region can be kept better in a dark state. It is noted that the number of the recesses in the pixel definition layer between adjacent pixel regions can be varied with actual requirements or process conditions, which is not limited thereto.

Figure 7:
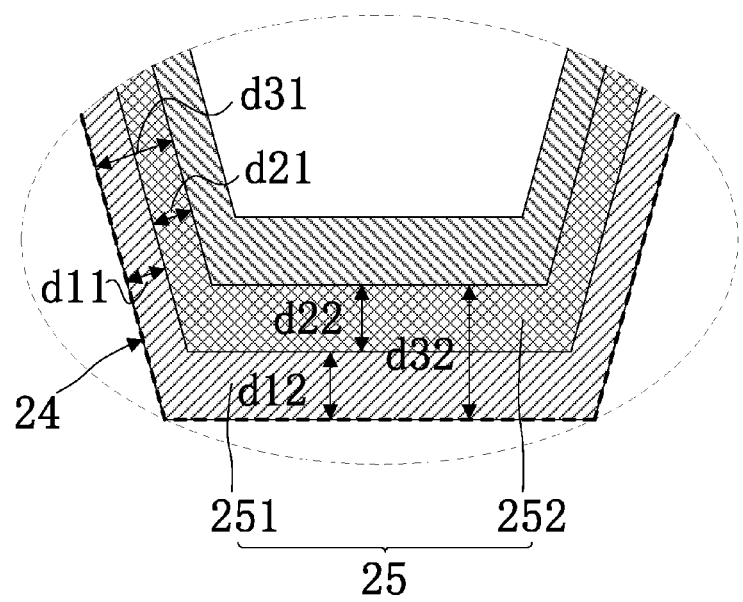
FIG. 7 is an enlarged schematic diagram of a region A in FIG. 2A.

FIG. 7 shows an enlarged schematic diagram of a region A in FIG. 2A according to embodiments of the disclosure. As shown in FIG. 7, a thickness d11 of the hole transport layer 251 covering the side wall of the recess 24 is less than a thickness d12 of the hole transport layer 251 covering the bottom of the recess 24, and a thickness d21 of the electron transport layer 252 covering the side wall of the recess 24 is less than a thickness d22 of the electron transport layer 252 covering the bottom of the recess 24, i.e. a thickness d31 of the organic common layer 25 covering the side wall of the recess 24 is less than a thickness d32 of the organic common layer 25 covering the bottom of the recess 24. Since the organic common layer 25 with the thickness d31 has a smaller resistance than the organic common layer 25 with the thickness d32 at the same length, the resistance of the organic common layer 25 between the pixel regions 23 can be further increased by decreasing the thickness d31 of the organic common layer 25 covering the side wall of the recess 24 with respect to the thickness d32 of the organic common layer 25 covering the bottom of the recess 24, thereby reducing or even eliminating the leakage current generated between the illuminating pixel region and the non-illuminating pixel region.

Additionally, as shown in FIGS. 3, 4 and 6, the thickness of the organic common layer 25 covering the side wall of the recess 24 is also less than that of the organic common layer 25 covering the bottom of the recess 24. Specific description can be referred to the related description of FIG. 7, which is not repeatedly discussed herein again.

In embodiments of the disclosure, the depth D of the recess 24 is larger than or equal to 2 μm. In some embodiments, the depth D of the recess 24 is larger than 2 μm and less than 6 μm. It has been found in experiments that the recess 24 having a depth larger than 2 μm can significantly increase the resistances of both the hole transport layer 251 and the electron transport layer 252 between pixel regions 23, thereby better reducing or even eliminating the leakage current generated between the illuminating pixel region 23 and the non-illuminating pixel region 23. With the existing process conditions, it is easy to form a recess 24 having a depth larger than 2 μm and less than 6 μm, and the depth of the recess 24 can be varied with requirements for an increase of resistances of both the hole transport layer 251 and the electron transport layer 252 between the pixel regions 23 and for an decrease of the leakage current. It is noted that the depth of the recess 24 may also be larger than or equal to 6 μm depending on actual requirements under allowable process conditions, which is not limited thereto.

In embodiments of the disclosure, each of the pixel regions in the display panel may be one of trichromatic pixel regions, i.e. a red pixel region, a green pixel region and a blue pixel region, or each of the pixel regions in the display panel may also be one of tetrachromatic pixel regions, i.e. a red pixel region, a green pixel region, a blue pixel region and a white pixel region, or alternatively a red pixel region, a green pixel region, a blue pixel region and a yellow pixel region. In the display panel, the pixel regions may be arranged as a matrix or be arranged in a staggered manner, or other arrangement manners, which is not limited thereto. The pixel regions in the display panel will be illustrated below as the trichromatic pixel regions to illustrate the arrangement of the pixel regions and the recesses, and such illustration may also be applied to the case that the pixel regions in the display panel are tetrachromatic pixel regions.

Figure 8A:
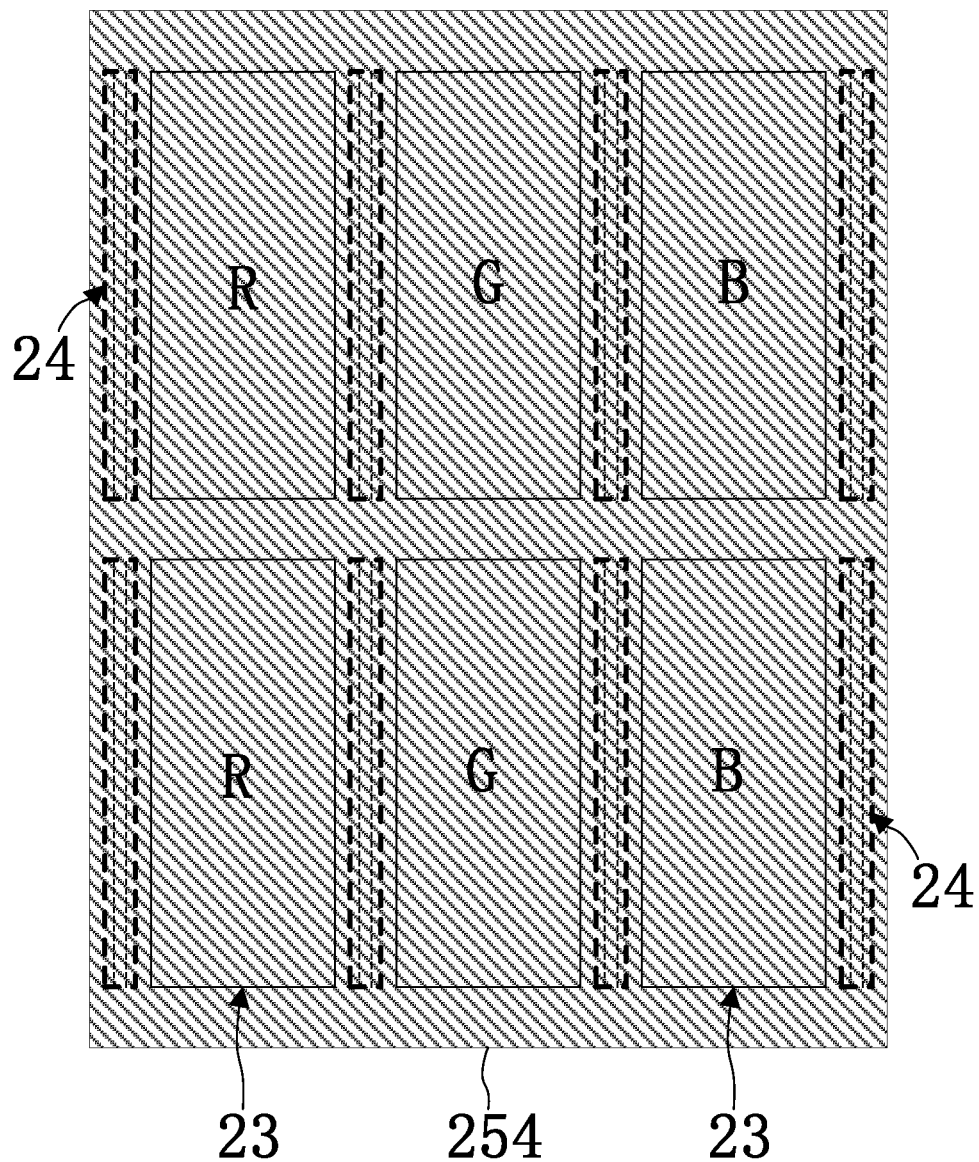
FIG. 8A is a schematic top view showing the partial structure of a display panel, according to embodiments of the disclosure.

FIG. 8A is a schematic top view showing the partial structure of a display panel, according to embodiments of the disclosure. As shown in FIG. 8A, the pixel regions 23 in the display panel are arranged as a matrix, where, R represents a red pixel region, G represents a green pixel region, and B represents a blue pixel region. As shown in FIG. 8A, the arrangement of the pixel regions 23 as a matrix may be such that: each column of pixel regions 23 is constituted by pixel regions of the same color, and each row of pixel regions 23 is constituted by the red, green and blue pixel regions R, G, B which are arranged alternately. As shown in FIG. 8A, the recesses 24 are provided in the pixel definition layer between pixel regions 23 of different colors. When the display panel displays the image and a portion of pixel regions in the display panel illuminates, if the illuminating pixel region is of a color different from that of a non-illuminating pixel region adjacent to the illuminating pixel region, the leakage current generated between the illuminating pixel region and the non-illuminating pixel region causes color crosstalk to the display panel, thereby decreasing quality of an image displayed by the display panel. In view of the above, the recess in the display panel is provided in the pixel definition layer between pixel regions of different colors, thereby effectively preventing color crosstalk from affecting chroma and quality of the image displayed by the display panel.

Figure 8B:
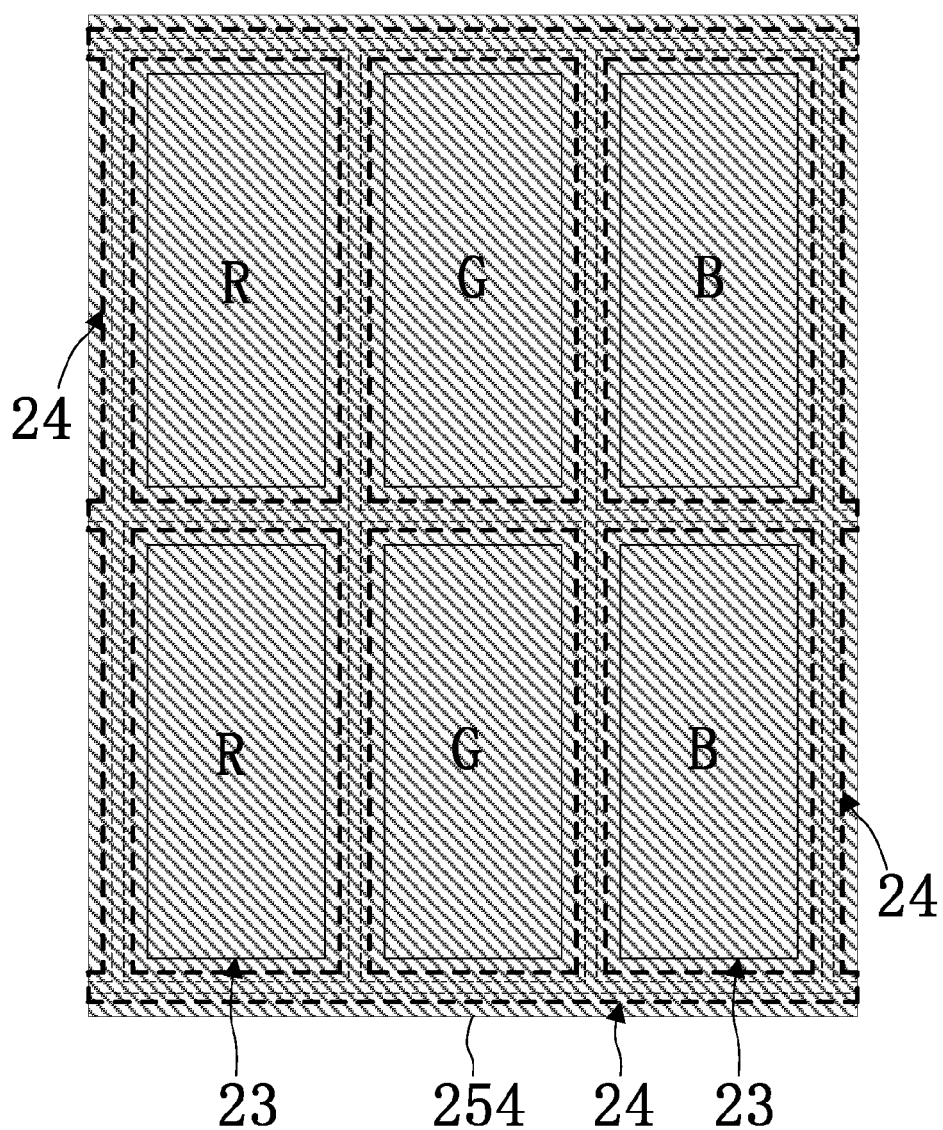
FIG. 8B is a schematic top view showing the partial structure of a display panel, according to embodiments of the disclosure.

Unlike the case that an illuminating pixel region and a non-illuminating pixel region adjacent to the illuminating pixel region are of different colors, an illuminating pixel region and a non-illuminating pixel region adjacent to the illuminating pixel region may also be of the same color, in this case, the leakage current generated between the illuminating pixel region and the non-illuminating pixel region adjacent to the illuminating pixel region could cause the non-illuminating pixel region to slightly illuminate. Therefore, as shown in FIG. 8B which is a schematic top view showing the partial structure of another display panel, according to embodiments of the disclosure, a recess 24 is provided in the pixel definition layer between every two adjacent pixel regions 23 in the case that the pixel regions 23 are arranged as a matrix, so that the effect of the leakage current between adjacent pixel regions on the quality of the image displayed by the display panel can be better prevented.

Figure 9:
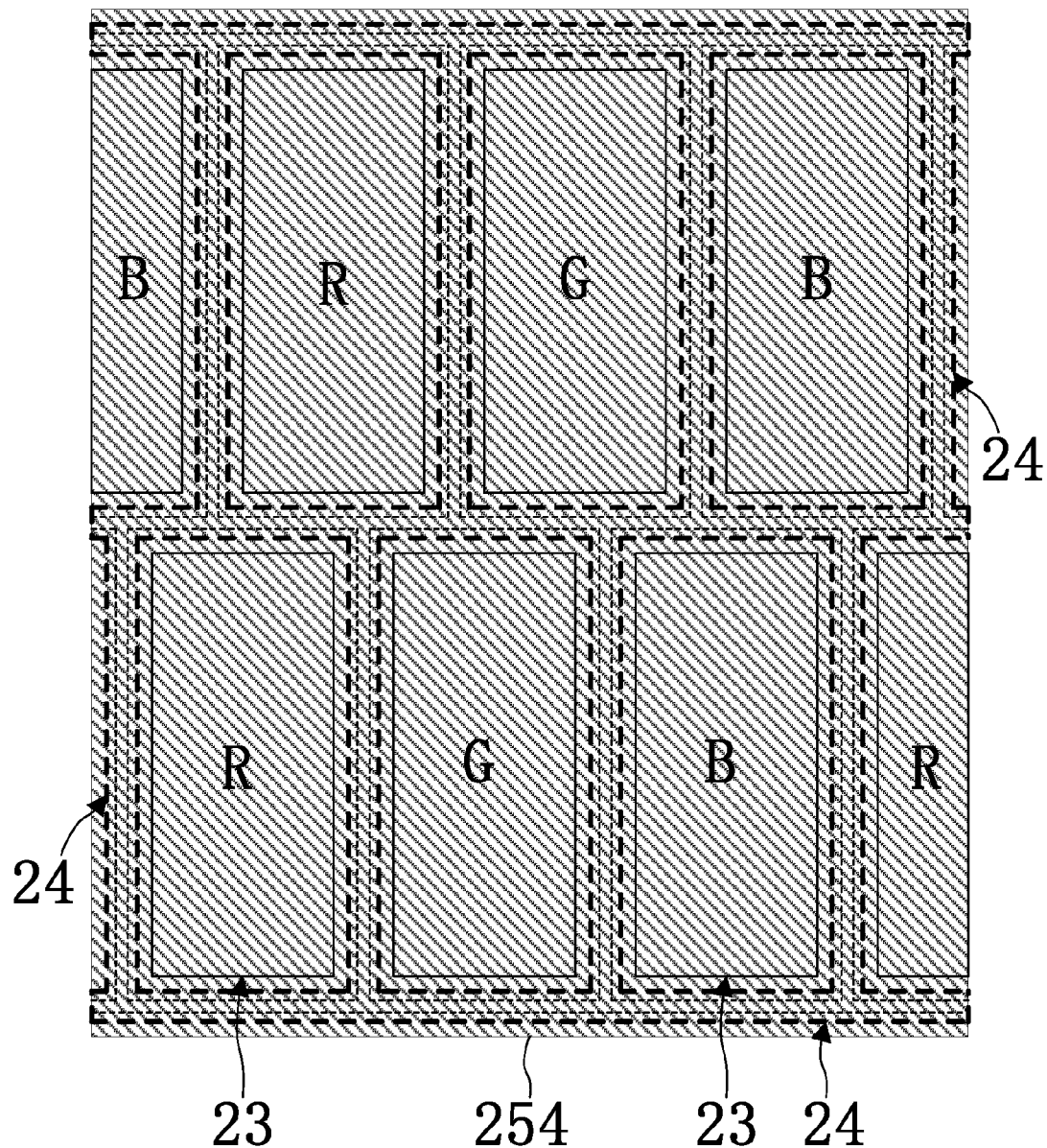
FIG. 9 is a schematic top view showing the partial structure of a display panel, according to embodiments of the disclosure.

Unlike the case that the pixel regions are arranged as a matrix, as shown in FIG. 9 which is a schematic top view showing the partial structure of a further display panel, according to embodiments of the disclosure, the pixel regions 23 in the display panel can also be arranged in such a staggered manner that: each row of pixel regions 23 is constituted by red, green and blue pixel regions R, G, B which are arranged alternately, and adjacent rows of pixel regions 23 are staggered with each other. For the case that the pixel regions 23 are arranged in the staggered manner, the recess 24 is required to be provided in the pixel definition layer between every two adjacent pixel regions 23, as shown in FIG. 9, in order to effectively reduce or even eliminate the leakage current generated between the illuminating pixel region and the non-illuminating pixel region adjacent to the illuminating pixel region.

In embodiments of the disclosure, the recess may be provided at either a pixel definition layer between pixel regions of different colors, or a pixel definition layer between pixel regions of the same color, or the recesses may be provided at both a pixel definition layer between pixel regions of different colors and a pixel definition layer between pixel regions of the same color, which is not limited thereto.

Figure 10:
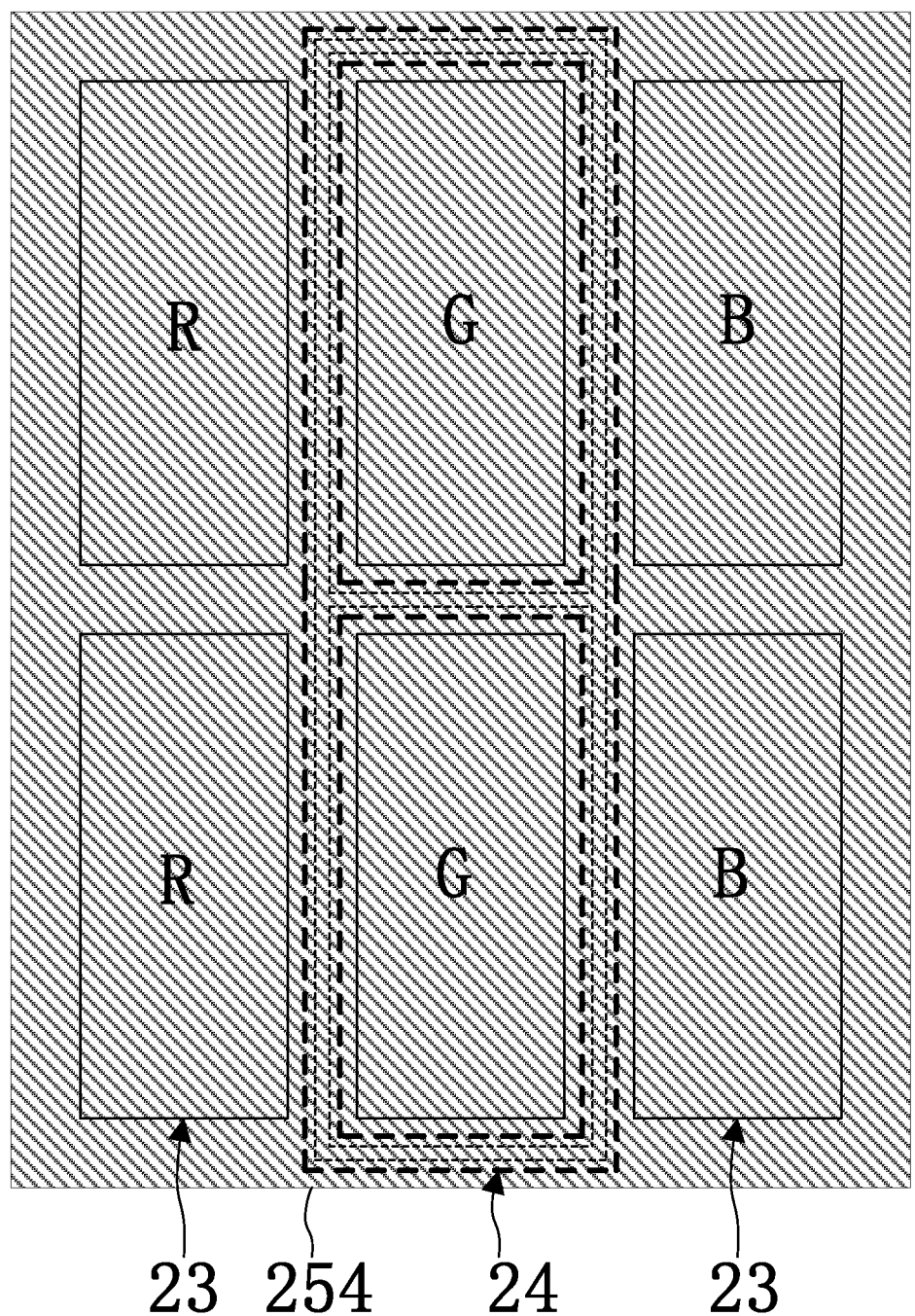
FIG. 10 is a schematic top view showing the partial structure of a display panel, according to embodiments of the disclosure.

From the perspective of materials for manufacturing pixel regions of different colors, the current efficiency of the material for manufacturing the green pixel region is much higher than that of the material for manufacturing pixel regions of other colors, and thus the leakage current generated between the pixel regions significantly affects the green pixel region. In view of the above, as shown in FIG. 10 which is a schematic top view showing the partial structure of a display panel, according to embodiments of the disclosure, the pixel definition layer between the pixel regions, where the recess is provided, includes a pixel definition layer around the green pixel region G. As such, the provision of the recess in the pixel definition layer around the green pixel region can reduce the impact of the leakage current generated between the green pixel region and the pixel region adjacent to the green pixel region on the green pixel region.

It is noted that the above FIGS. 8A, 8B, 9 and 10 are schematic top views showing the partial structure of the display panels of the disclosure. Of course, the whole display panel includes more pixel regions. For example, for the display panel shown in FIG. 8A, at least one column of pixel regions may be provided at the left side of the first column of pixel regions 23, at least one column of pixel regions may also be provided at the right side of the third column of pixel regions 23, at least one row of pixel regions may be provided at the upside of the first row of pixel regions 23, and at least one row of pixel regions may also be provided at the downside of the first row of pixel regions 23. Likewise, more pixel regions can be provided in the display panels shown in FIGS. 8B, 9 and 10, so that the arrangement of the pixel regions in the whole display panel can be obtained.

The above display panel may have or not have a touch sensing function, depending on specific requirements in actual manufacturing. The touch function may be an electromagnetic touch sensing function, a capacitive touch sensing function or an electromagnetism and capacitance integrated touch sensing function.

Figure 11:
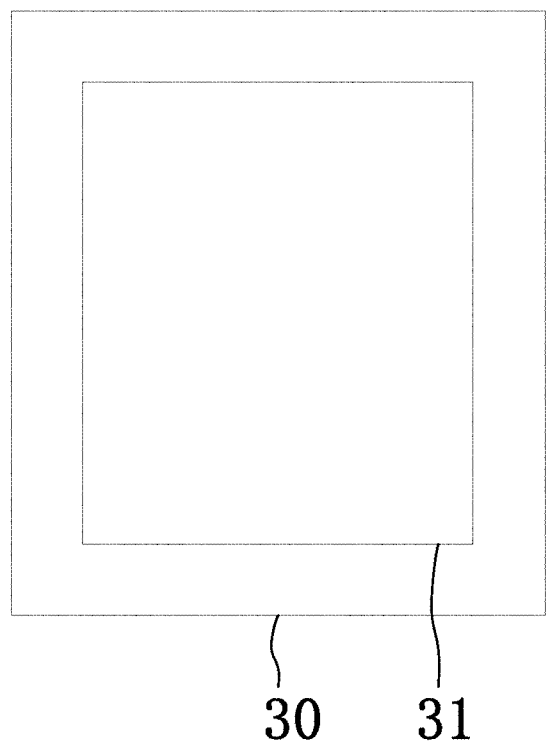
FIG. 11 is a schematic diagram showing the structure of a display device, according to embodiments of the disclosure.

Embodiments of the disclosure provide a display device. FIG. 11 is a schematic diagram showing the structure of a display device, according to embodiments of the disclosure. As shown in FIG. 11, the display device 30 includes a display panel 31, and can further include a drive circuit and other means for supporting a normal operation of the display device. The display panel 31 is the display panel described according to any of the above embodiments. The display device may be one of a mobile phone, a desktop computer, a tablet computer, an electric paper, etc.

Figure 12:
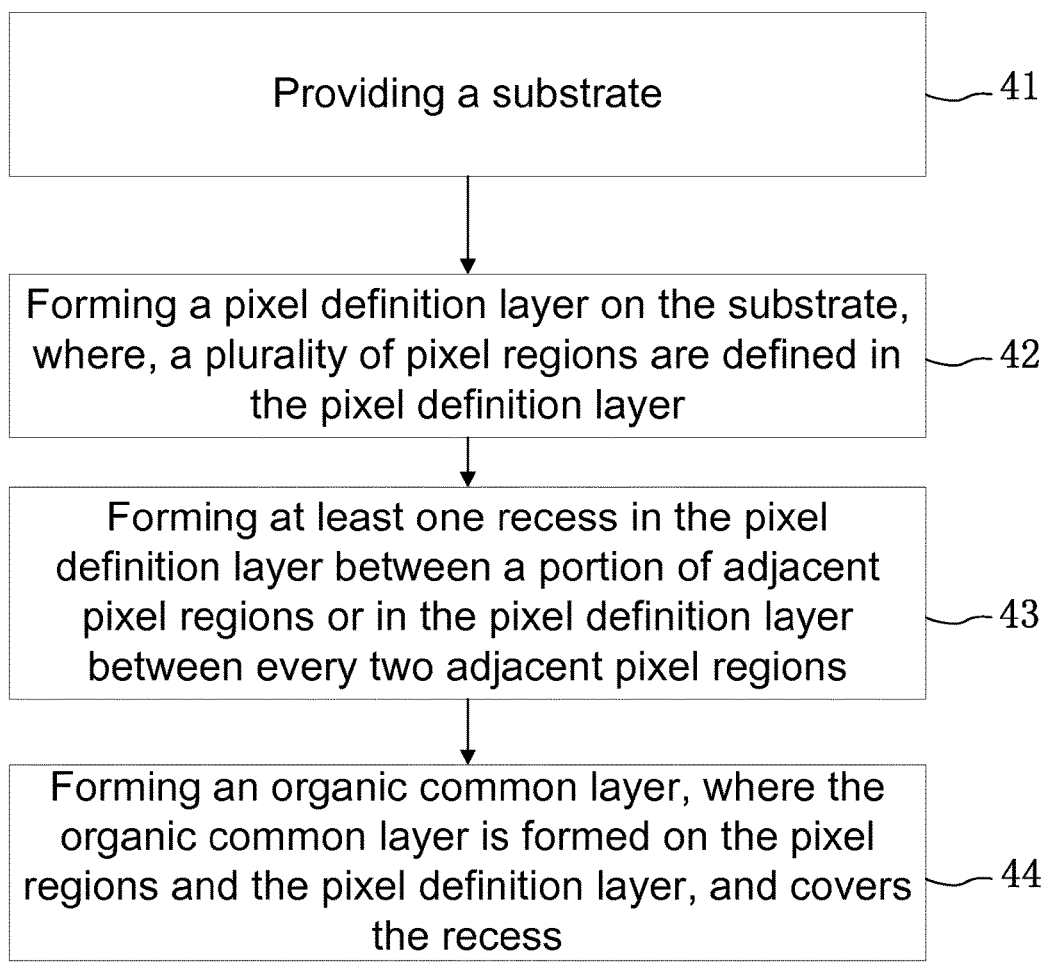
FIG. 12 is a flowchart diagram showing the manufacturing method of a display panel, according to embodiments of the disclosure.

Embodiments of the disclosure provide a manufacturing method of a display panel. The manufacturing method is configured to manufacture the display panel described according to any of the above embodiments. FIG. 12 is a flowchart diagram showing the manufacturing method of the display panel, according to embodiments of the disclosure. As shown in FIG. 12, the manufacturing method of the display panel includes Steps 41 to 44 below.

Step 41 includes providing a substrate.

Step 42 includes forming a pixel definition layer on the substrate, where, a plurality of pixel regions are defined in the pixel definition layer.

In embodiments of the disclosure, the manufacturing method of the display panel further includes: forming a planarization layer between the substrate and the pixel definition layer. In manufacturing the display panel, a thin film transistor layer may be formed on the substrate, and then the planarization layer and the pixel definition layer are sequentially formed on the thin film transistor layer. It is noted in embodiments of the disclosure that a direction from the substrate to the pixel definition layer is referred to as an upward direction, and an opposite direction thereof is referred to as a downward direction. Describing one element as being above or below another element merely intends to illustrate the relative orientation of the elements, the elements may be in direct contact with each other or be separate, and specific structure thereof is not limited herein.

Step 43 includes forming at least one recess in a portion of the pixel definition layer between adjacent pixel regions or in every pixel definition layer between two adjacent pixel regions. In some embodiments, the depth of the recess is larger than 0.5 μm. In some embodiments, the depth of the recess is larger than 2 µm. In some embodiments, the depth of the recess is larger than 2 µm and less than 6 µm.

In some embodiments, the recess is formed by using an etching or laser radiation process. In the disclosure, the quality of the pixel definition layer before forming the recess is larger than that of the pixel definition layer formed with the recess, i.e. the quality of the pixel definition layer is reduced in forming the recess. As such, the recess can be formed by using the etching or laser radiation process, such as a dry etching process, a wet etching process or a laser burning process, so as to obtain the recess as described above.

In embodiments of the disclosure, the step of forming at least one recess in a portion of the pixel definition layer between adjacent pixel regions or in every pixel definition layer between two adjacent pixel regions may include: forming at least one recess in a portion of the pixel definition layer between adjacent pixel regions or in every pixel definition layer between two adjacent pixel regions, and forming the bottom of the recess in the pixel definition layer or at a position where the pixel definition layer contacts the planarization layer.

In embodiments of the disclosure, since the planarization layer is disposed below the pixel definition layer of the display panel and is configured to planarize a surface of the thin film transistor layer below the planarization layer, the step of forming at least one recess in a portion of the pixel definition layer between adjacent pixel regions or in every pixel definition layer between two adjacent pixel regions may also include: forming at least one recess which extends through a portion of the pixel definition layer between adjacent pixel regions or through every pixel definition layer between two adjacent pixel regions until into the planarization layer, and the bottom of the recess is formed in the planarization layer, so as to increase the depth of the recess.

Step 44 includes forming an organic common layer, where the organic common layer is formed on the pixel regions and the pixel definition layer, and covers the recess.

In particular, the organic common layer may include a hole transport layer and an electron transport layer.

It is noted that the order of the Steps 41 to 44 described above can be adjusted appropriately according to actual process conditions and levels. For example, for the case that the bottom of the recess is formed in the pixel definition layer or formed at a position where the pixel definition layer contacts the planarization layer, the recess can be formed by manufacturing a pixel definition layer with a recess-shaped structure using the half-tone mask while forming the pixel definition layer. Therefore, the order of the steps described above is not limited thereto. As such, the display panel, according to embodiments of the disclosure, can be manufactured by performing Steps 41 to 44 described above, and the detail description for the display panel can refer to the above embodiments.

The display panel manufactured by the above manufacturing method can be used as the AMOLED display panel. Unlike the case where a recess is not disposed between the pixel regions in the related art, the recess is disposed in the pixel definition layer between a portion of adjacent pixel regions or disposed in the pixel definition layer between every two adjacent pixel regions in the display panel of the disclosure, and the recess is covered by the organic common layer, so that the length of the organic common layer between the pixel regions can be increased, and thus the resistances of both the hole transport layer and the electron transport layer between the adjacent pixel regions can be increased. When a pixel region in the display panel illuminates, the transfer of the electrons and/or holes between the illuminating pixel region and a non-illuminating pixel region adjacent to the illuminating pixel region can be reduced because the resistances of both the hole transport layer and the electron transport layer between the adjacent pixel regions are increased, and hence the leakage current generated between the illuminating pixel region and the non-illuminating pixel region can be reduced or even eliminated, so that the non-illuminating pixel region can be kept in a dark state, thereby improving quality of an image displayed by the display panel.

In embodiments of the disclosure, the pixel definition layer between a portion of adjacent pixel regions may be either a pixel definition layer between pixel regions of the same color, or a pixel definition layer between pixel regions of different colors, or may include both a pixel definition layer between pixel regions of the same color and a pixel definition layer between pixel regions of different colors, which is not limited thereto.

Figure 13:
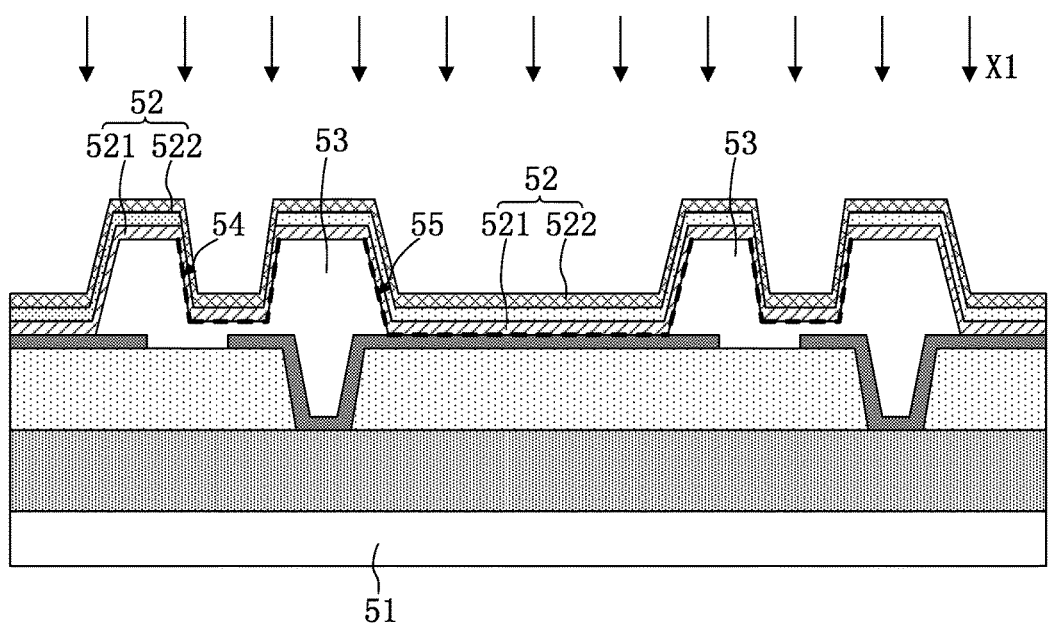
FIG. 13 is a schematic diagram of forming an organic common layer by means of vapor deposition, according to embodiments of the disclosure.

In embodiments of the disclosure, the organic common layer may be formed by means of vapor deposition. As shown in FIG. 13, a direction X1 of the vapor deposition for forming the organic common layer 52 is perpendicular to the substrate 51. In FIG. 13, a reference numeral 521 represents a hole transport layer, a reference numeral 522 represents an electron transport layer, a reference numeral 53 represents a pixel definition layer, a reference numeral 54 represents a recess, and a reference numeral 55 represents a pixel region. The organic common layer is formed by means of vapor deposition and the direction X1 of the vapor deposition is perpendicular to the substrate 51, so that the thickness of the organic common layer 52 formed on a side wall of the recess 54 is less than the thickness of the organic common layer 52 formed on the bottom of the recess 54. Therefore, the resistance of the organic common layer 52 formed on the side wall of the recess 54 is larger than the resistance of the organic common layer 52 formed on the bottom of the recess 54 and having the same length as the organic common layer 52 formed on the side wall of the recess 54, so that the leakage current generated between the illuminating pixel region and the non-illuminating pixel region can further be reduced or even eliminated, and the non-illuminating pixel region can be kept in a dark state, thereby improving quality of an image displayed by the display panel.

Except that the direction of the vapor deposition for forming the organic common layer is perpendicular to the substrate, an angle may also be formed between the direction of the vapor deposition and a direction perpendicular to the substrate. In some embodiments, the angle is an acute angle. Since the organic common layer is formed by using such vapor deposition of the direction which forms an angle with the direction perpendicular to the substrate, the organic common layer formed in the recess might be discontinuous, and hence the resistance of the organic common layer between the pixel regions may be considered as infinite, so that the leakage current generated between the illuminating pixel region and the non-illuminating pixel region can be restrained, and the non-illuminating pixel region can be kept in a dark state, thereby improving quality of an image displayed by the display panel.

In embodiments of the disclosure, specifically, the direction of the vapor deposition for forming the organic common layer can be varied by adjusting the position of a vapor deposition source. It is well known by those skilled in the art how to adjust the vapor deposition source, which is not repeated discussed again herein.

Figure 14:
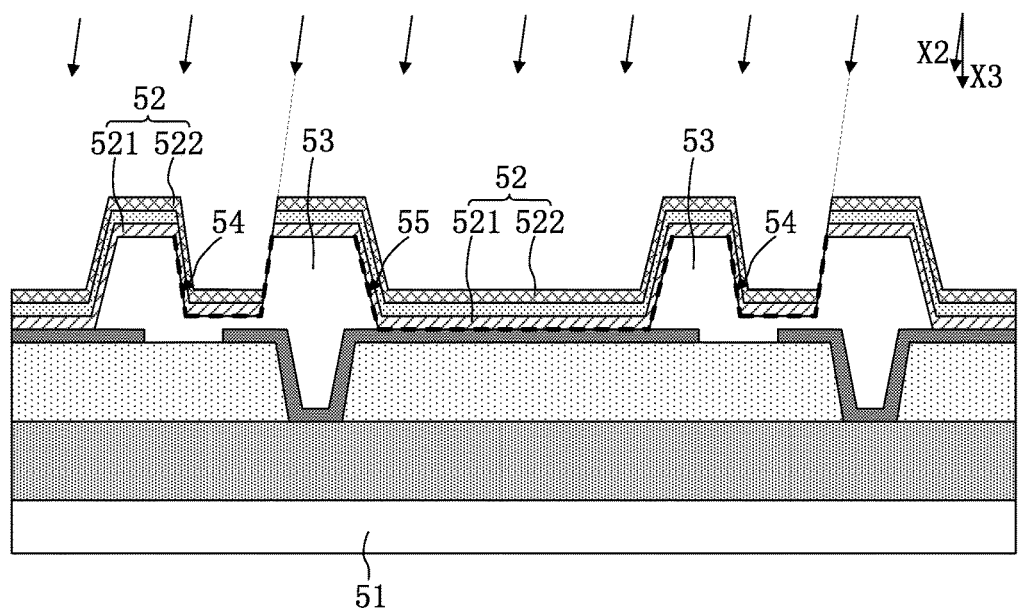
FIG. 14 is a schematic diagram of forming an organic common layer by means of another vapor deposition, according to embodiments of the disclosure.

In embodiments of the disclosure, as shown in FIG. 14, an angle is formed between a direction X2 of vapor deposition and a direction X3 perpendicular to the substrate 51, and the direction X2 of vapor deposition is parallel to an inclination direction of the right side wall of the recess 54. However, the direction of the vapor deposition may alternatively be parallel to an inclination direction of the left side wall of the recess. Given that the direction of the vapor deposition for forming the organic common layer is parallel to the inclination direction of one side wall of the recess, the left or right side wall of the recess is not covered by the organic common layer, i.e. the organic common layer formed in the recess is discontinuous, such that the resistance of the organic common layer between the corresponding pixel regions becomes infinite, and thus the leakage current generated between the illuminating pixel region and the non-illuminating pixel region can be restrained, and the non-illuminating pixel region can be kept in a dark state, thereby improving quality of an image displayed by the display panel.

Figure 15:
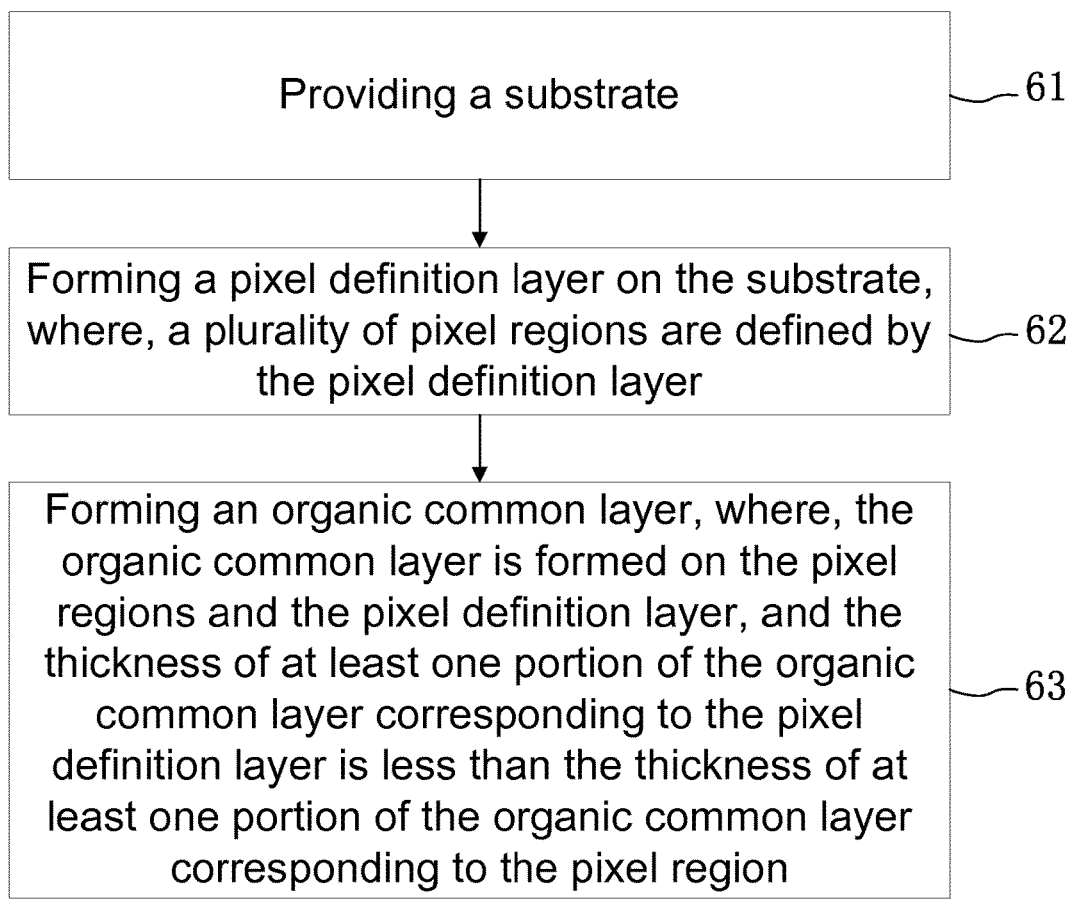
FIG. 15 is a flowchart diagram showing another manufacturing method of a display panel, according to embodiments of the disclosure.

FIG. 15 is a flowchart diagram showing another manufacturing method of a display panel, according to embodiments of the disclosure. As shown in FIG. 15, the manufacturing method of the display panel includes Steps 61 to 63 below.

Step 61 includes providing a substrate.

Step 62 includes forming a pixel definition layer on the substrate, where, a plurality of pixel regions are defined by the pixel definition layer.

Step 63 includes forming an organic common layer, where, the organic common layer is formed on the pixel regions and the pixel definition layer, and the thickness of at least one portion of the organic common layer corresponding to the pixel definition layer is less than the thickness of at least one portion of the organic common layer corresponding to the pixel region.

The detailed description with respect to above Steps 61 to 63 can refer to the related description of the display panel in the above embodiments, which is not repeated discussed herein.

With the display panel, the display device and the manufacturing method of the display panel, a thickness of at least one portion of the organic common layer corresponding to the pixel definition layer in the display panel is less than that of at least one portion of the organic common layer corresponding to the pixel region; or at least one recess is disposed in a portion of the pixel definition layer between adjacent pixel regions or in every pixel definition layer between two adjacent pixel regions, and the organic common layer covers the recess, such that the resistance of the organic common layer between the pixel regions can be increased, and thus the leakage current generated between the illuminating pixel region and the non-illuminating pixel region can be reduced or even restrained, and the non-illuminating pixel region can be kept in a dark state, thereby improving quality of an image displayed by the display panel.

It is noted that the embodiments and the applied technology principles of the disclosure are merely described as above. It should be understood for those skilled in the art that the disclosure is not limited to particular embodiments described herein. Various apparent changes, readjustment and alternative can be made by those skilled in the art without departing the scope of protection of the disclosure. Therefore, although the disclosure is illustrated in detail through the above embodiments, the disclosure is not merely limited to the above embodiments, and can further include more of other equivalent embodiments without departing the conception of the disclosure. The scope of the disclosure is subject to the appended claims.

Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A display panel, comprising:
   a substrate;
   a planarization layer disposed on the substrate;
   a pixel definition layer disposed on the planarization layer, with a plurality of pixel regions being defined in the pixel definition layer, wherein the plurality of pixel regions include a red pixel region, a blue pixel region and a green pixel region; and
   an organic common layer disposed on the pixel regions and the pixel definition layer;
   wherein a recess is disposed in a portion of the pixel definition layer between adjacent pixel regions, the organic common layer partially covers the recess, and the recess encloses the green pixel region.

2. The display panel of claim 1, wherein, the organic common layer comprises a hole transport layer and an electron transport layer.

3. The display panel of claim 1, wherein, a depth of the recess is larger than or equal to 0.5 μm.

4. The display panel of claim 3, wherein, the depth of the recess is larger than or equal to 2 μm.

5. The display panel of claim 4, wherein, the depth of the recess is larger than 2 μm and less than 6 μm.

6. The display panel of claim 1, wherein, the recess extends through the pixel definition layer and extends into the planarization layer, and a bottom of the recess is disposed in the planarization layer.

7. The display panel of claim 1, wherein, a thickness of the organic common layer covering a side wall of the recess is less than a thickness of the organic common layer covering the bottom of the recess.

8. The display panel of claim 1, wherein, each of the plurality of pixel regions is enclosed by the recess separately.

9. A display device, comprising the display panel of claim 1.

10. A manufacturing method of a display panel, comprising:
    providing a substrate;
    forming a planarization layer on the substrate;
    forming a pixel definition layer on the planarization layer, with a plurality of pixel regions being defined in the pixel definition layer;
    forming a recess in a portion of the pixel definition layer between adjacent pixel regions; and
    forming an organic common layer, wherein, the organic common layer is formed on the pixel regions and the pixel definition layer and partially covers the recess,
    wherein the display panel, comprises:
    the substrate;
    the planarization layer disposed on the substrate;
    the pixel definition layer disposed on the planarization layer, with a plurality of pixel regions being defined in the pixel definition layer, wherein the plurality of pixel regions include a red pixel region, a blue pixel region and a green pixel region; and the organic common layer disposed on the pixel regions and the pixel definition layer, wherein the recess encloses the green pixel region.

11. The manufacturing method of claim 10, wherein, the recess is formed by an etching or laser radiation process.

12. The manufacturing method of claim 10, wherein, a depth of the recess is larger than 0.5 μm.

13. The manufacturing method of claim 12, wherein, a depth of the recess is larger than 2 μm.

14. The manufacturing method of claim 10, wherein, the recess extends through the pixel definition layer and extends into the planarization layer, and the bottom of the recess is disposed in the planarization layer.

15. The manufacturing method of claim 10, wherein, the organic common layer is formed by means of vapor deposition, and a direction of the vapor deposition is perpendicular to the substrate; or an angle is formed between the direction of the vapor deposition and a direction perpendicular to the substrate, wherein, the angle is an acute angle.

16. The manufacturing method of claim 15, wherein, an angle is formed between the direction of the vapor deposition and a direction perpendicular to the substrate, and the direction of the vapor deposition is parallel to an inclination direction of the side wall of the recess.

17. The display panel of claim 1, wherein, the recess includes a first sidewall, a second sidewall and a bottom, the organic common layer covers the first sidewall and the bottom of the recess, but does not cover the second sidewall of the recess.

18. The display panel of claim 1, wherein, the recess includes a first sidewall, a second sidewall and a bottom, the organic common layer covers the first sidewall of the recess, but does not cover the second sidewall and the bottom of the recess.

19. The display panel of claim 18, wherein, the organic common layer partially covers the first sidewall of the recess.

20. The display panel of claim 1, wherein, the recess includes a plurality of first sub recesses extending in a first direction and a plurality of second sub recesses extending in a second direction, the first direction is substantially perpendicular to the second direction, the plurality of first sub recesses intersect the plurality of second sub recesses such that each of the plurality of pixel regions is enclosed by the recess separately.

* * * * *